(12) United States Patent
Borthakur et al.

(10) Patent No.: US 9,515,111 B2
(45) Date of Patent: Dec. 6, 2016

(54) CIRCUITRY FOR BIASING LIGHT SHIELDING STRUCTURES AND DEEP TRENCH ISOLATION STRUCTURES

(71) Applicant: SEMICONDUCTOR COMPONENTS INDUSTRIES, LLC, Phoenix, AZ (US)

(72) Inventors: Swarnal Borthakur, Boise, ID (US); Marc Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 179 days.

(21) Appl. No.: 14/518,862

(22) Filed: Oct. 20, 2014

(65) Prior Publication Data

US 2016/0111463 A1 Apr. 21, 2016

(51) Int. Cl.
*H01L 27/146* (2006.01)
*H04N 5/335* (2011.01)
*H04N 5/369* (2011.01)
*H04N 5/235* (2006.01)
*H04N 5/238* (2006.01)

(52) U.S. Cl.
CPC ..... *H01L 27/14623* (2013.01); *H01L 27/1462* (2013.01); *H01L 27/1463* (2013.01); *H01L 27/1464* (2013.01); *H01L 27/14636* (2013.01); *H01L 27/14687* (2013.01); *H04N 5/238* (2013.01); *H04N 5/2354* (2013.01); *H04N 5/335* (2013.01); *H04N 5/3698* (2013.01)

(58) Field of Classification Search
CPC ................... H01L 27/14623; H01L 27/14636; H01L 27/1463; H01L 27/14687; H01L 27/1462; H01L 27/1464; H04N 5/238; H04N 5/2354; H04N 5/335; H04N 5/3698

See application file for complete search history.

(56) References Cited

U.S. PATENT DOCUMENTS

| | | |
|---|---|---|
| 6,709,885 B2 | 3/2004 | Uppal et al. |
| 6,967,073 B2 | 11/2005 | Fasen et al. |
| 8,149,311 B2 | 4/2012 | Yu |
| 8,736,006 B1 | 5/2014 | Tsai et al. |
| 8,803,271 B2 | 8/2014 | Liu et al. |
| 2003/0038326 A1 | 2/2003 | Fasen et al. |
| 2010/0140728 A1 | 6/2010 | Banghart et al. |
| 2010/0238331 A1 | 9/2010 | Umebayashi et al. |
| 2011/0233702 A1* | 9/2011 | Takahashi ......... H01L 21/76898 257/432 |

(Continued)

*Primary Examiner* — Mekonnen Dagnew
(74) *Attorney, Agent, or Firm* — Treyz Law Group, P.C.; Jason Tsai

(57) ABSTRACT

An imaging system may include an image sensor die stacked on top of a digital signal processor (DSP) die. Through-oxide vias (TOVs) may be formed in the image sensor die and may extend at least partially into in the DSP die to facilitate communications between the image sensor die and the DSP die. The image sensor die may include light shielding structures for preventing reference photodiodes in the image sensor die from receiving light and in-pixel grid structures for preventing cross-talk between adjacent pixels. The light shielding structure may receive a desired biasing voltage through a corresponding TOV, an integral plug structure, and/or a connection that makes contact directly with a polysilicon gate. The in-pixel grid may have a peripheral contact that receives the desired biasing voltage through a light shield, a conductive strap, a TOV, and/or an aluminum pad.

27 Claims, 10 Drawing Sheets

(56) References Cited

U.S. PATENT DOCUMENTS

| | | |
|---|---|---|
| 2012/0086094 A1 | 4/2012 | Watanabe |
| 2012/0313208 A1 | 12/2012 | Kim et al. |
| 2013/0200251 A1 | 8/2013 | Velichko |
| 2013/0248862 A1 | 9/2013 | Inoue et al. |
| 2014/0008755 A1 | 1/2014 | Koike |
| 2014/0049812 A1* | 2/2014 | Palanchoke ............ G02B 5/208 359/360 |
| 2014/0061839 A1 | 3/2014 | Ting et al. |
| 2014/0191347 A1 | 7/2014 | Hayakawa et al. |
| 2014/0291793 A1 | 10/2014 | Tanaka |

* cited by examiner

CIRCUITRY FOR BIASING LIGHT SHIELDING STRUCTURES AND DEEP TRENCH ISOLATION STRUCTURES

BACKGROUND

This relates generally to imaging systems, and more particularly, to imaging systems with tungsten light shields and in-pixel light grids.

Modern electronic devices such as cellular telephones, cameras, and computers often use digital image sensors. Imaging systems (i.e., image sensors) often include a two-dimensional array of image sensing pixels. Each pixel typically includes a photosensitive element such as a photodiode that receives incident photons (light) and converts the photons into electrical signals. The imaging system contains an image sensor die having an array of photodiodes formed in a semiconductor substrate. The image sensor die is mounted on a digital signal processor (DSP) die.

In particular, the image sensor die includes active photodiodes that receive incoming light and reference photodiodes that do not receive incoming light. A metallic light shield such as a tungsten light shield is formed over the reference photodiodes to prevent the reference photodiodes from receiving light. In one conventional arrangement, the tungsten light shield is shorted to ground by forming a via from the tungsten light shield to a deep contact in the semiconductor substrate. The formation of the via from the tungsten light shield to the deep contact, however, requires extra processing steps and thereby increases cost. Contact to the silicon substrate relies on adequate doping of p-wells or n-wells in the silicon substrate to form an Ohmic contact. Otherwise, there will be high contact resistance, and the tungsten shield will not be properly grounded. For deep p-wells or n-wells, the doping at the bottom may not be adequate to form a robust Ohmic contact. In another conventional arrangement, the tungsten light shield can be shorted to ground by coupling the tungsten light shield to the aluminum wire bond pad via an aluminum strap. The formation of the aluminum strap coupling the tungsten light shield to the aluminum wire bond pad, however, yields an undesirable topography.

In-pixel light grids have also been developed to help improve isolation between the active photodiodes in the array. The in-pixel light grids, however, are not shorted to ground, which can be problematic and can cause undesired coupling effects.

It would therefore be desirable to provide improved ways of biasing the tungsten light shields and the in-pixel light grids.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
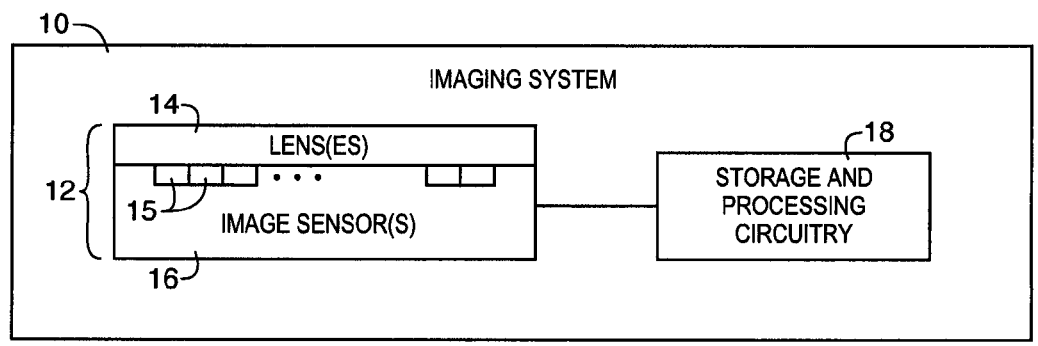
FIG. 1 is a diagram of an illustrative imaging system that may include a camera module having an image sensor in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. Image sensor 16 may, for example, be a backside illumination (BSI) image sensor. If desired, camera module 12 may be provided with an array of lenses 14 and an array of corresponding image sensors 16. Image sensor 16 may include an array of image sensor pixels such as an array of image sensor pixels 15 and a corresponding array of color filter elements.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
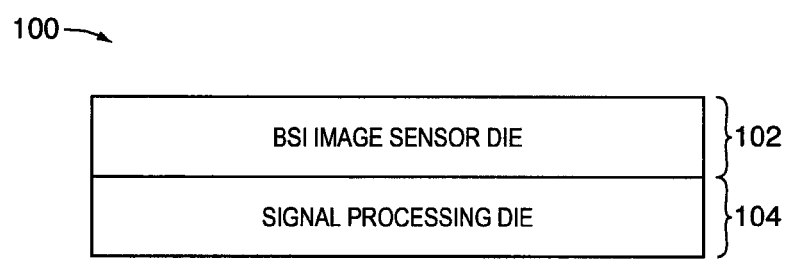
FIG. 2 is a diagram of an illustrative imaging system that includes a backside illuminated (BSI) image sensor die stacked on top of a signal processing die in accordance with an embodiment of the present invention.

FIG. 2 shows an imaging system 100 that includes an image sensor die 102 stacked on top of a signal processing die 104. Image sensor die 102 may be a backside illuminated (BSI) image sensor (as an example). Configured in this way, image sensor die 102 may include an array of image sensor pixels operable to produce image data (i.e., still or video data). Image data produced by image sensor die 102 may then be fed to signal processing die for further processing. Die 104 may sometimes be referred to as a digital signal processor (DSP). The example of FIG. 2 is merely illustrative. If desired, image sensor die 102 may be a front-side illuminated (FSI) image sensor die.

In conventional imaging systems, circuitry within a DSP die may communicate with circuitry within an image sensor die that is stacked on top of the DSP die using through-oxide vias. Through-oxide vias are formed in a first processing step. Light shielding structures are then formed over the through-oxide vias in a second processing step after the first processing step. Color filter housing structures are then formed over corresponding image sensor pixels in the image sensor in a third processing step after the second processing step. It is generally desirable to provide some way of biasing the light shielding structures.

Figure 3:
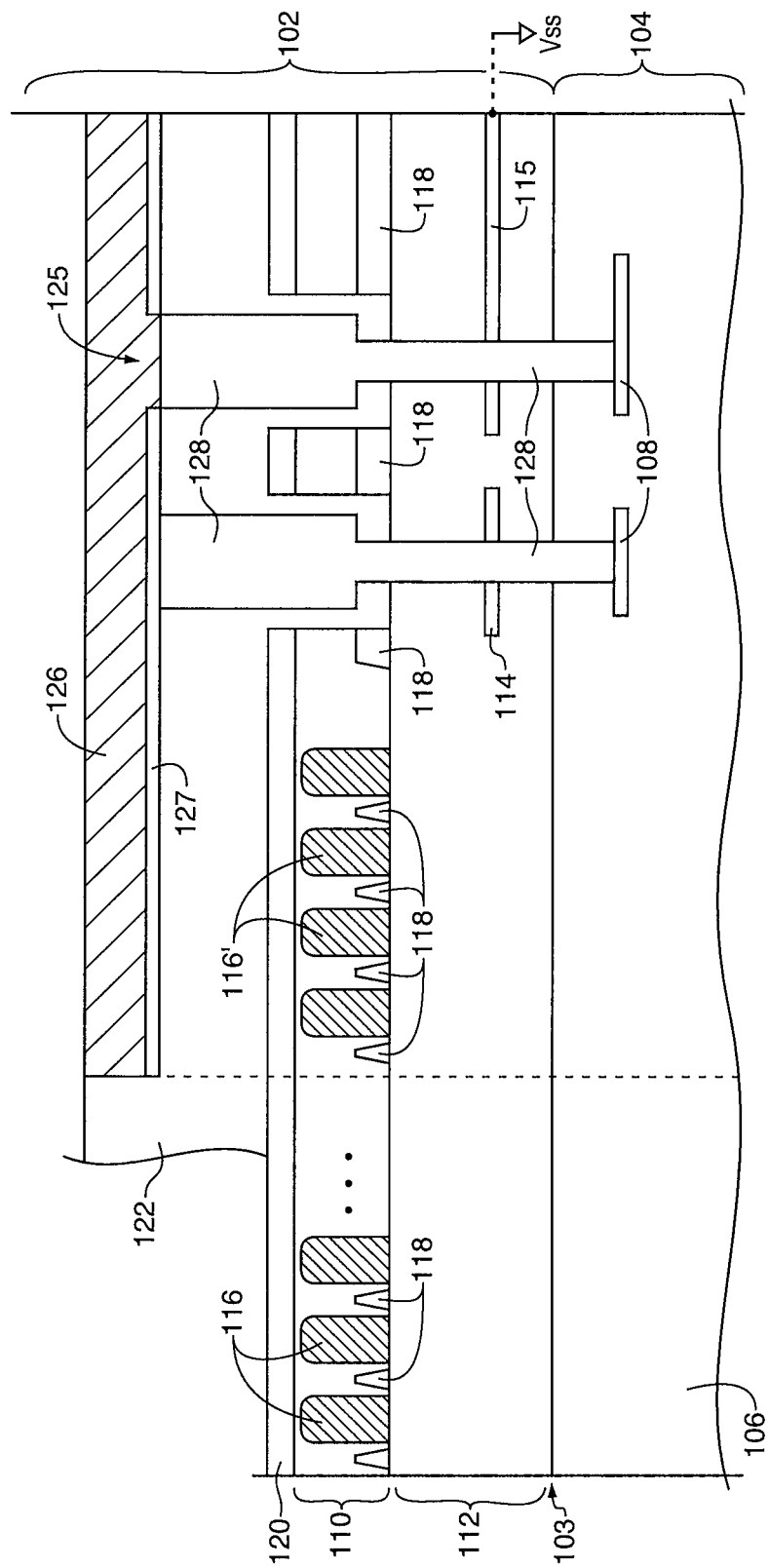
FIG. 3 is a cross-sectional side view of an illustrative imaging system having a light shielding structure that is shorted to a through-oxide via in accordance with an embodiment of the present invention.

In accordance with an embodiment of the present invention, an image sensor die is provided that includes light shielding structures biased to some desirable voltage level. FIG. 3 is a cross-sectional side view of image sensor die 102 that is stacked on top of signal processing die 104. The interface at which dies 102 and 104 are stacked is marked by arrow 103. As shown in FIG. 3, image sensor die 102 may include a substrate 110 having a front surface and a back surface and interconnect routing layers 112 formed on the front surface of substrate 110. Layers 112 may include alternating metal routing layers and via layers (e.g., routing structures formed in dielectric material) and may sometimes be referred to collectively as a dielectric stack.

Photosensitive elements such as photodiodes 116 may be formed at the front surface of substrate 110. Photodiodes 116 that are formed in an "active" portion of image sensor die 102 may receive incoming light and convert the incoming light into corresponding pixel signals, whereas photodiodes 116' that are formed in a peripheral portion of image sensor 102 may not receive any incoming light and may serve as reference photodiodes for noise canceling purposes (as an example). Shallow trench isolation (STI) structures such as STI structures 118 may be formed in the front surface of substrate 110 between each adjacent pair of photodiodes. STI structures 118 may serve to ensure that neighboring photodiodes are electrically isolated from one another.

An antireflective coating (ARC) layer such as ARC layer 120 may be formed at the back surface of substrate 110. Layer may be formed from hafnium oxide (as an example). ARC layer 120 may be formed from hafnium oxide, tantalum oxide, and/or other suitable antireflective material and may serve to ensure that light entering substrate 110 from the back side is not reflected back towards the direction from which it arrived.

Dielectric material 122 (e.g., an oxide layer) may be formed over layer 120. As shown in FIG. 3, inter-die via structures such as via structures 128 may traverse through at least a portion of die 102 and die 104. Via structures 128 may serve to connect circuitry within die 102 to circuitry within die 104. For example, vias 128 may connect metal routing structures 114 and 115 in dielectric stack 112 of die 102 to corresponding metal routing structures 108 in a dielectric stack 106 within die 104. Vias 128 formed in this way may facilitate communication between die 102 and die 104. Vias 128 may be formed through the oxide material in layers 122, 112, and 106 and may therefore sometimes be referred to herein as "through-oxide" vias (TOVs). Vias 128 may also be formed through STI structures 118 at the front surface of substrate 110. TOVs 128 may be formed from copper, aluminum, tungsten, silver, gold, a combination of these materials, or other suitable conducting material.

In one suitable arrangement, light shielding structures such as light shielding structure 126 may be formed in dielectric layer 122. Light shield 126 may serve to prevent light from reaching the reference photodiodes 116' or yet other structures in the peripheral/inactive portion of image sensor die 102. Light shield 126 may, for example, include a layer of conductive material (e.g., tungsten) and an adhesion layer (e.g., a titanium nitride layer). If desired, light shield 126 may be formed from other types of conductive material and adhesion material. In at least some embodiments, a passivation layer such as layer 127 may be formed at the bottom surface of light shield 26. Layer 127 may be formed from nitride and is sometimes referred to as a bottom antireflective coating layer or "BARC" layer.

It is generally desirable for light shield 126 to be biased to some predetermined voltage level. In the example of FIG. 3, light shield 126 may be directly coupled to one of the TOVs 128 by forming a hole 125 in nitride layer 127. An additional nitride etching step may be used to form hole 125 and the same material that is used to form light shield 126 may be deposited in hole 125 to directly short light shield 126 to the corresponding TOV 128. As shown in FIG. 3, TOV 128 that is shorted to light shield 126 may be coupled to metal routing path 115, which can receive ground voltage Vss via an external wirebond pad connection (as an example). This is merely illustrative. If desired, metal routing path 115 can receive a positive power supply voltage Vcc, an intermediate voltage that is between Vcc and Vss, or even a negative power supply voltage so that light shield 126 is biased to the desired voltage level. Metal interconnect 115 may be coupled to external power supply circuitry, an on-die voltage regulator, or other circuitry that is capable of providing a bias voltage.

Figure 4:
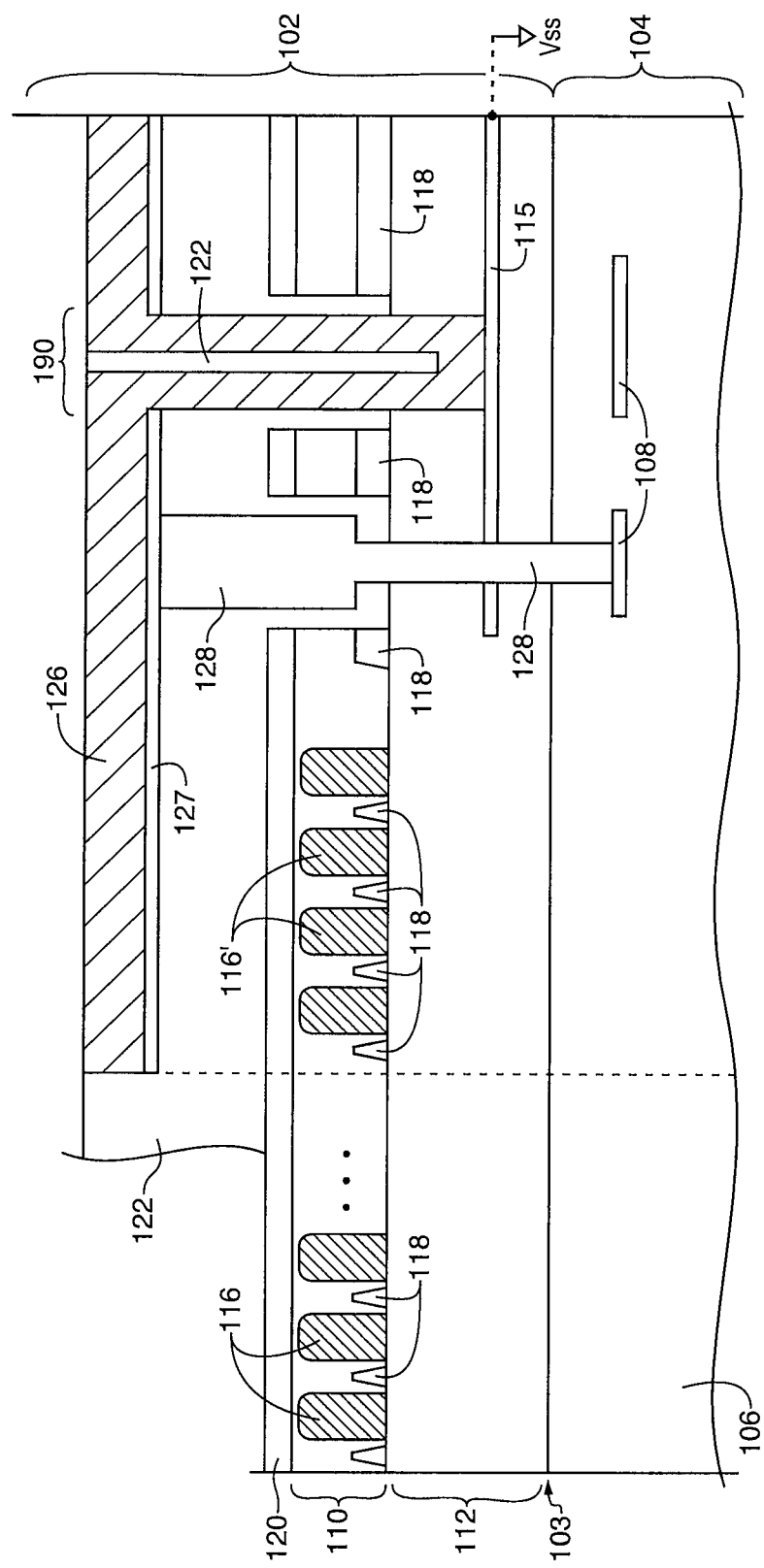
FIG. 4 is a cross-sectional side view of an illustrative imaging system having a light shielding structure that directly contacts an interconnect metal routing path using a via structure that is integral with the light shielding structure in accordance with an embodiment of the present invention.

In another suitable arrangement, light shield 126 may be integrally coupled to metal routing interconnect 115 (see, e.g., FIG. 4). Consider, as an example, that light shield 126 is a tungsten light shield. As shown in FIG. 4, a tungsten via or "plug" 190 may be formed that traverses down through layer 122, substrate 110, and a portion of stack 112 to make contact with metal path 115. As in the previous example of FIG. 3, metal path 115 of FIG. 4 may be coupled to ground voltage Vss, positive power supply voltage Vcc, other power supply voltage, or any suitable voltage biasing level.

To form plug 190, an etch will need to be performed to form an opening through layers 127, 122, 110, and 112. Thereafter, shielding structure 126 and plug 190 can be formed simultaneously by depositing the desired conductive shielding material over the reference photodiodes 116' and within the opening (i.e., light shielding structure 126 and plug 190 may be formed at the same time using the same material). Dielectric material 122 may be deposited in the opening to fill any remaining cavity. Formed in this way, a plug 190 that is integral with shield 126 makes direct contact with metal routing path 115, thereby obviating the need for at least one TOV that is used to short light shield 126 to some biasing circuitry (as is shown in the case of FIG. 3). In the example of FIG. 4, metal routing path 115 may still be coupled to another TOV 128 to help short metal path 108 in die 104 to ground or other power supply voltage levels.

In either the embodiment of FIG. 3 or 4, if TOV 128 and metal routing path 115 were to be formed from copper, copper may be exposed and can potentially result in contamination during deposition of the light shielding material. In another suitable arrangement, light shield 126 may be directly coupled to a conductive gate structure (which is typically not formed from copper), and as a result, can minimize the probability of copper contamination (see, e.g., FIG. 5).

Figure 5:
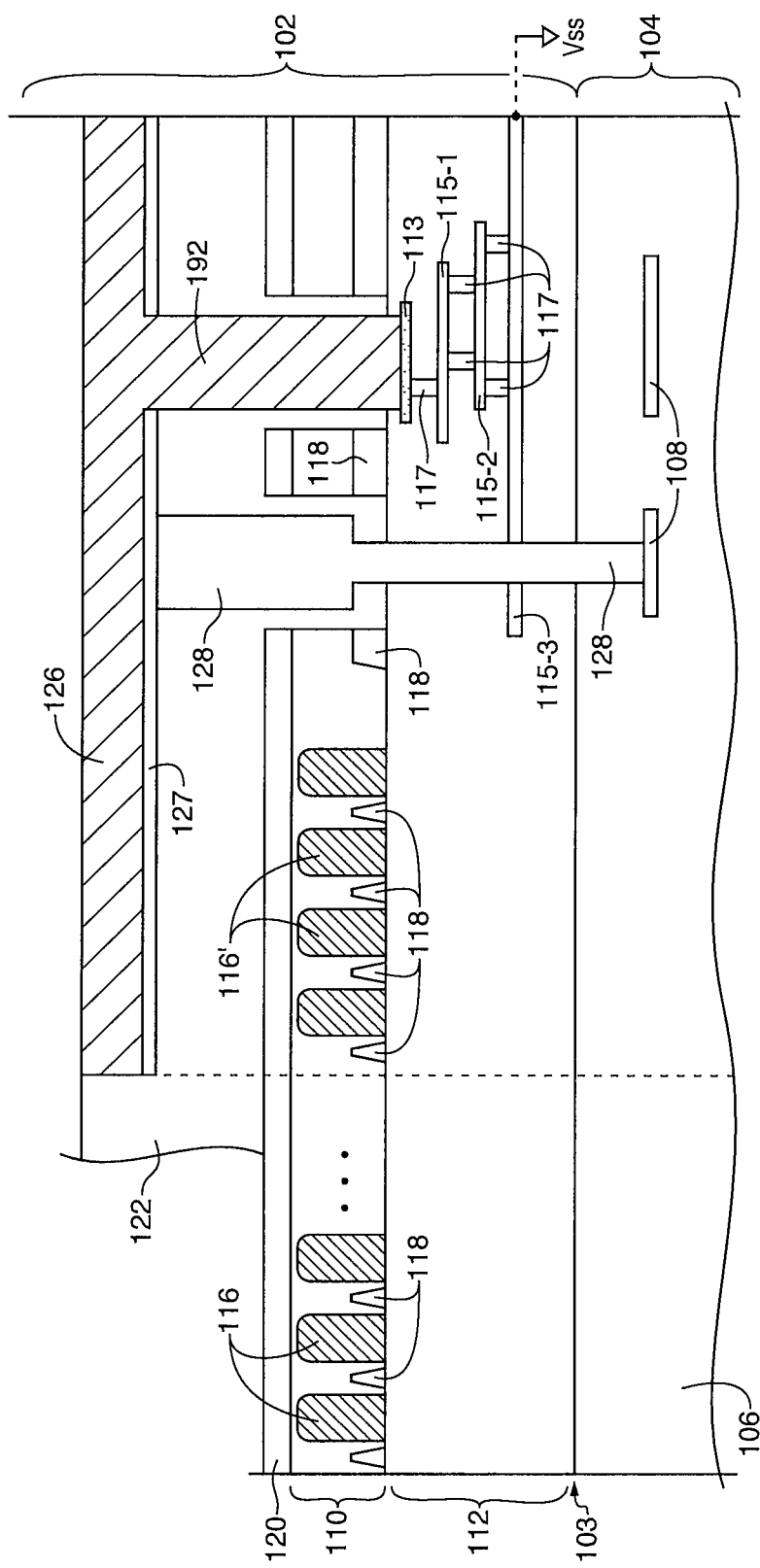
FIG. 5 is a cross-sectional side view of an illustrative imaging system having a light shielding structure that is coupled to a polysilicon gate structure in accordance with an embodiment of the present invention.

As shown in FIG. 5, a contact structure 192 that is integrally formed with light shield 126 may have a first end that is shorted to the bottom surface of light shield 126 and a second end that terminates at a corresponding gate structure 113 (e.g., a polysilicon gate structure). Consider, as an example, that light shield 126 is a tungsten light shield. As shown in FIG. 5, a tungsten contact 192 may be formed that traverses down through layer 122, substrate 110, and a portion of stack 112 to make contact with polysilicon gate conductor 113. Gate conductor 113 may be coupled to metal routing structure 115-1 in a first metal routing layer in dielectric stack 112 (sometimes referred to as the "M1" metal routing layer), to metal routing structure 115-2 in a second metal routing layer in dielectric stack 112 (sometimes referred to as the "M2" metal routing layer), and to metal routing structure 115-3 in a third metal routing layer in dielectric stack 112 (sometimes referred to as the "M3" metal routing layer). As in the previous example of FIG. 4, metal path 115-3 of FIG. 4 may be coupled to ground voltage Vss, positive power supply voltage Vcc, other power supply voltage, or any suitable voltage biasing level and may still be coupled to another TOV 128 to help short metal path 108 in die 104 to ground or other power supply voltage levels.

To form contact 192, an etch will need to be performed to form an opening through layers 127, 122, 110, and 112. Thereafter, shielding structure 126 and contact 192 can be formed simultaneously by depositing the desired conductive shielding material over the reference photodiodes 116' and within the opening. Formed in this way, since only polysilicon is exposed during formation of contact 192 and shield 126, copper contamination issues are minimized.

In general, color filter elements may be formed over the active photodiodes in the image sensor die. These color filter elements can be inserted into corresponding color filter housing structures 208 (see, e.g., FIG. 6). Color filter housing structures 208 may include an array of slots 209 in which color filter elements may be inserted. An array of color filter elements that are contained within such types of housing structures are sometimes referred to as a CFA-in-a-box (abbreviated as "CIAB"). Color filter array housing structures 208 may have walls that are formed from the dielectric material (e.g., oxide) and may serve to provide improved light guiding capabilities for directing light to desired image sensor pixels.

Figure 6:
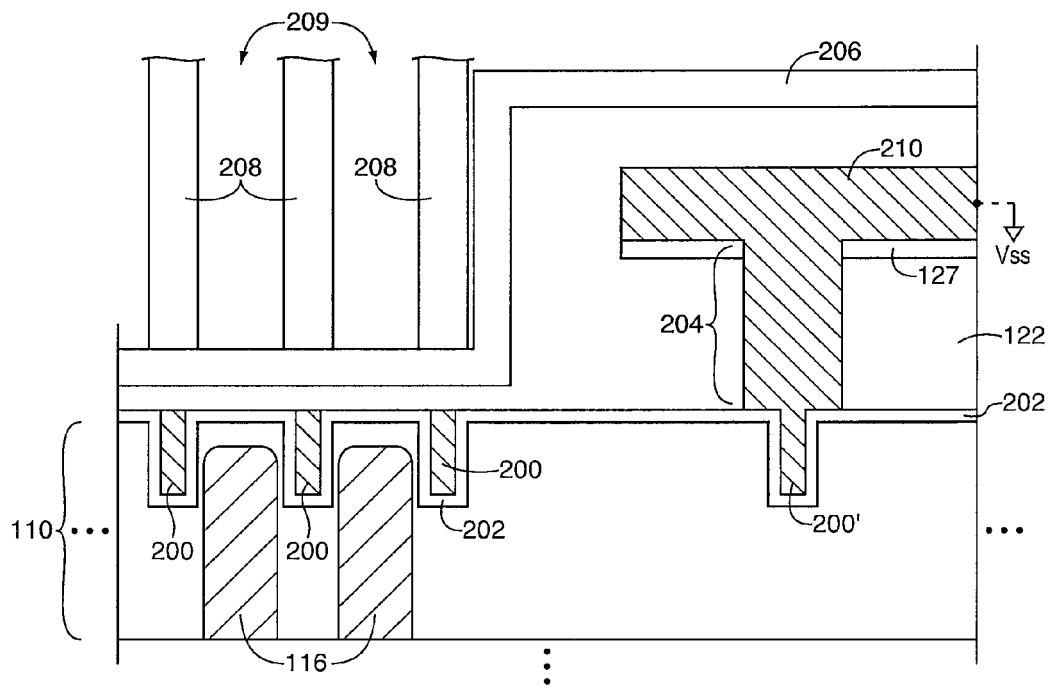
FIG. 6 is a cross-sectional side view showing how a peripheral conductive deep trench isolation (DTI) contact may be coupled to a conductive strap or shielding structure in accordance with an embodiment of the present invention.

In at least some embodiments, an opaque grid structure such as grid 200 may be formed over the image sensor pixels in the active portion. Grid 200 may be formed from metal or other opaque materials and may also help direct light to the desired image sensor pixels. Grid structure 200 may be a grid-shaped series of intersecting opaque lines that define a rectangular array of pixel openings (see, e.g., FIG. 7). Each of the openings in the grid may be aligned with an active photodiode 116 and a corresponding slot 209 in the color filter array housing 208. Grid structure 200 formed in this way may sometimes be referred to as an in-pixel grid or an in-pixel matrix. In the example of FIG. 6, an additional dielectric sidewall coating such as oxide liner 202 may formed between substrate 110 and the in-pixel grid 200. Liner 202 may be formed from dry oxide material such as hafnium oxide or tantalum oxide or any other high-k dielectric material (e.g., materials with a dielectric constant greater than that of silicon).

In the example of FIG. 6, the in-pixel grid is formed from deep trench isolation (DTI) structures 200 constructed at the back surface of substrate 110. Deep trench structures 200 may be formed from tungsten and may therefore be referred to as a tungsten DTI (as an example). This is merely illustrative. In general, the in-pixel matrix may be formed from opaque structures that are formed only partially within semiconductor substrate 110, completely within substrate 110, or completely out of substrate 110.

Figure 7:
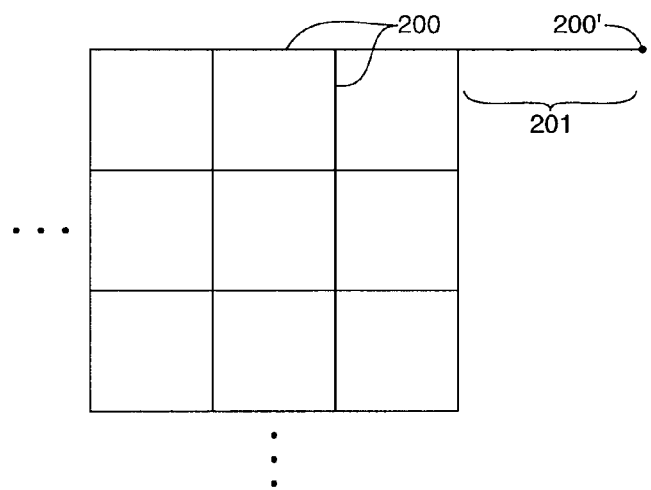
FIG. 7 is a diagram showing how a conductive DTI array grid may be coupled to a peripheral DTI contact in accordance with an embodiment of the present invention.

It is generally desirable to provide some way of biasing the in-pixel grid. As shown in FIG. 7, the in-pixel grid may be coupled to a peripheral contact 200' via a contact line 201. Contact 200' may be formed outside the active photodiode array region and may serve to receive a supply voltage so that the in-pixel grid is biased to some predetermined voltage level during normal operation of the image sensor die. Referring back to FIG. 6, peripheral DTI contact 200' may be coupled to conductive structure 210 using a corresponding via 204. Dielectric material 122 may be formed below and above conductive structure 210. A passivation layer such as nitride layer 206 may also be formed on dielectric material 122 and may serve to isolate color filter array housing structure 208 from dielectric 122.

Structure 210 may be a light shielding structure (e.g., light shield 126 of FIGS. 3-5) or may be a conductive strap that is coupled to other structures that receive a biasing voltage (e.g., a conductive strap that is coupled to a nearby TOV that is biased to a power supply voltage). Structure 210 may be biased to some voltage level using at least one of the configurations described in connection with FIGS. 3-5. Conductive via 204 may be formed from the same material that is used to form structure 210. In one example, structure 210 may be a tungsten light shield, conductive via 204 may be a tungsten plug, and peripheral DTI 200' may be a tungsten DTI (i.e., structure 210, via 204, and peripheral DTI 200' may all be formed from the same material). This is merely illustrative. If desired, structures 210, 204, and 200' may be formed from different materials.

Figure 8:
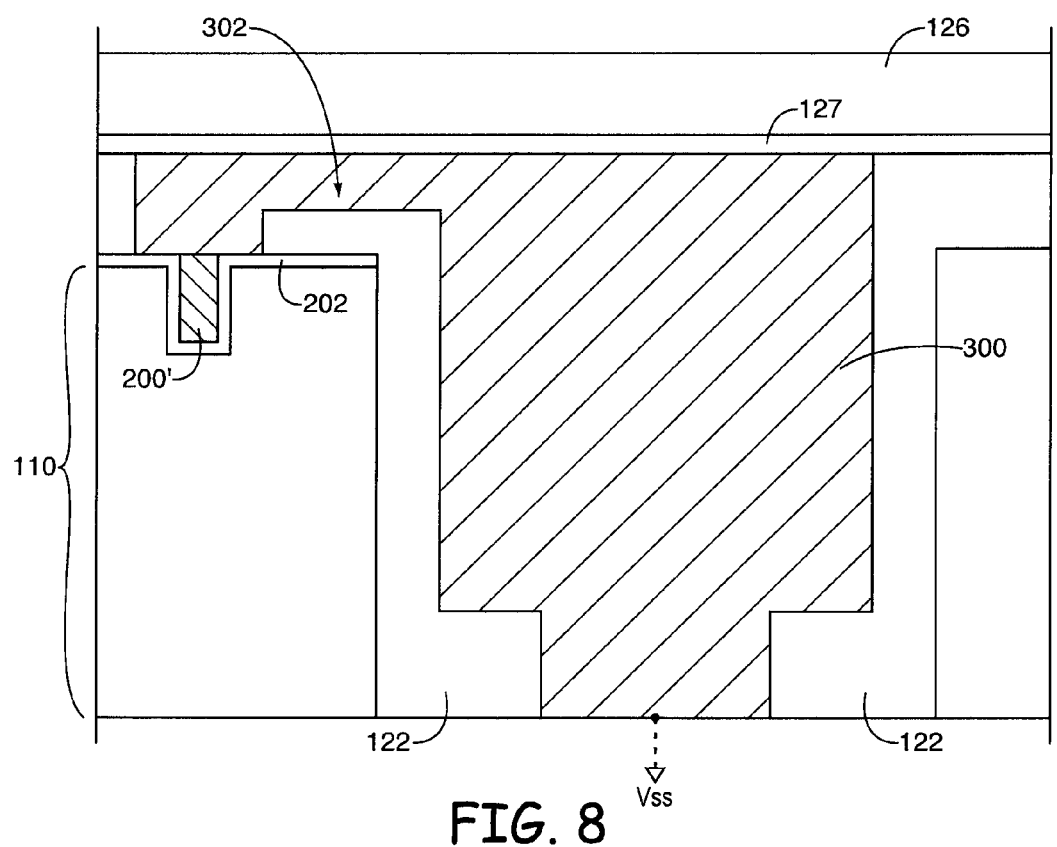
FIG. 8 is a cross-sectional side view showing how a peripheral DTI contact may be coupled to a through-oxide via using an associated strap in accordance with an embodiment of the present invention.

FIG. 8 shows another suitable embodiment in which peripheral contact 200' is coupled to a neighboring TOV 300. For example, consider a scenario in which TOV 300 is a copper TOV. As shown in FIG. 8, copper TOV 300 may be coupled to DTI 200' through a corresponding copper strap 302. Strap 302 may form an electrical contact with DTI 200' via a copper damascene process (as an example). BARC layer 127 may separate the copper material from light shield 126. In this example, TOV 300 may be coupled to ground voltage Vss, positive power supply voltage Vcc, a negative power supply voltage, or other suitable bias voltage levels.

Figure 9:
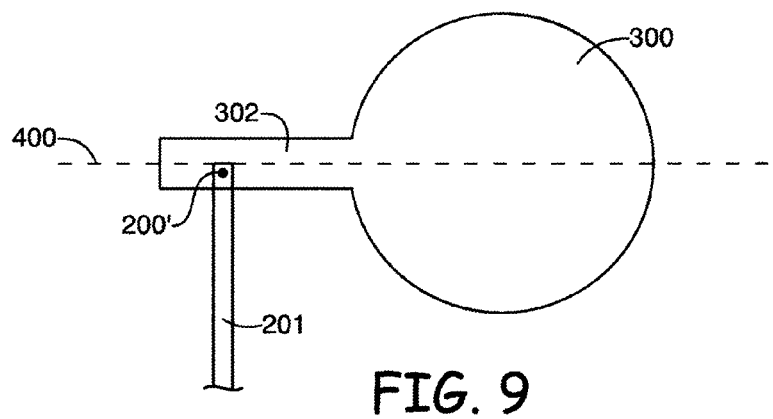
FIG. 9 is a top view showing how the peripheral DTI contact of FIG. 8 is connected to the through-oxide via (TOV) at a location outside the TOV in accordance with an embodiment of the present invention.

FIG. 9 is a top view showing how the peripheral DTI contact of FIG. 8 is connected to TOV 300 at a location outside TOV 300. As shown in FIG. 9, strap 302 extends from TOV 300 to a location that is outside of the TOV, and in-pixel contact line 201 is routed towards strap 302 and makes contact with strap 302 at the location outside of the TOV. The view of FIG. 8 represents the cross-section of the structures of FIG. 9 cut along dotted line 400.

Figure 10:
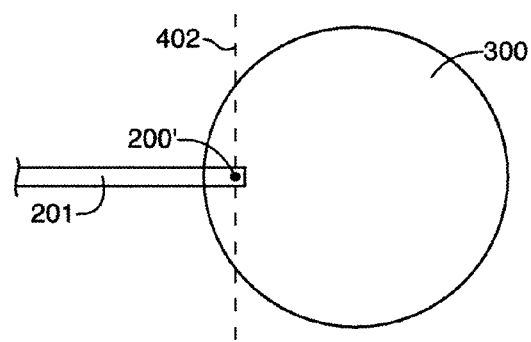
FIG. 10 is a top view showing how a peripheral DTI contact may be connected to a through-oxide via (TOV) at a location inside the TOV in accordance with an embodiment of the present invention.
Figure 11:
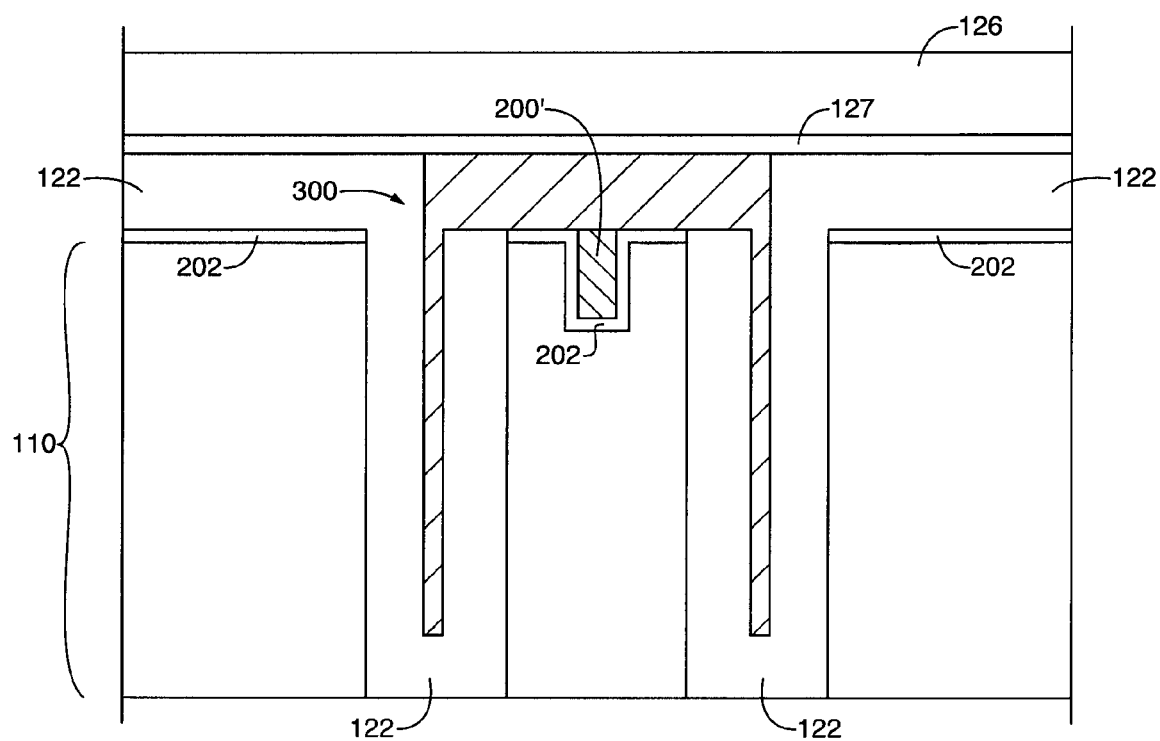
FIG. 11 is a cross-sectional side view showing how the peripheral DTI contact of FIG. 10 is connected to the inside of the TOV in accordance with an embodiment of the present invention.

FIG. 10 shows another suitable configuration in the peripheral DTI contact may be connected to TOV 300 at a location inside the TOV. As shown in FIG. 10, in-pixel contact line 201 is routed into TOV 300, so strap 302 need not be formed. The cross-sectional side view of the structures of FIG. 10 cut along dotted line 402 is shown in FIG. 11. As shown in FIG. 11, peripheral DTI contact 200' may make direct physical and electrical contact with TOV 300. The area directly beneath and surrounding DTI 300' may be substrate material 110. Since the DTI contact 200' is routed to inside the TOV, this substrate region directly beneath the DTI is also surrounded by the TOV material. In this example, BARC layer 127 may separate the TOV 300 from light shield 126. As described previously, TOV 300 may be coupled to ground voltage Vss, positive power supply voltage Vcc, or other suitable bias voltage levels.

Figure 12:
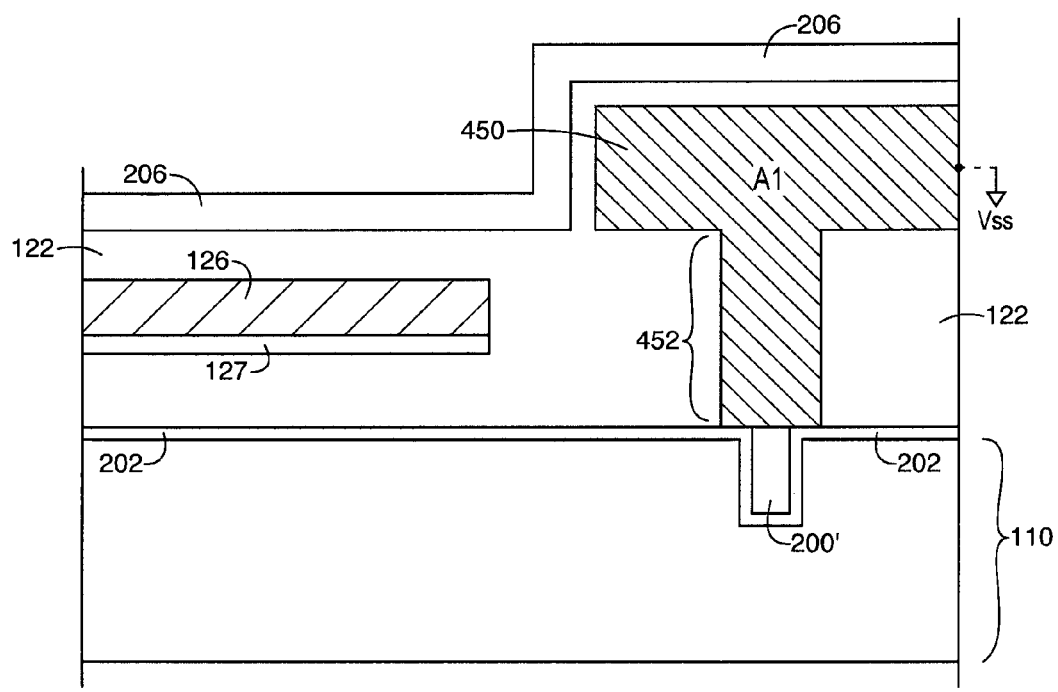
FIG. 12 is a cross-sectional side view showing how a peripheral DTI contact may be shorted to an aluminum strap in accordance with an embodiment of the present invention.

FIG. 6 shows peripheral in-pixel contact 200' coupled to conductive structure 210 (e.g., a light shield or some other strapping structure); FIGS. 8 and 9 shows contact 200' coupled to a TOV 300 from outside the TOV; and FIGS. 10 and 11 shows contact 200' coupled to a TOV 300 from inside the TOV. In yet another suitable embodiment, peripheral DTI contact 200' may be coupled an aluminum strapping structure 450 (see, e.g., FIG. 12). As shown in FIG. 12, aluminum strap 450 may be coupled to DTI contact 200' using a corresponding aluminum via 452 that is formed through dielectric material 122. Strap 450 may be coupled to an aluminum wirebond pad that can receive an external bias voltage (e.g., Vss, Vcc, or other desired voltage level). In the example of FIG. 12, a passivation layer such as nitride layer 206 may also be formed on dielectric material 122 over aluminum strap 450 and light shield 126.

As described above, the light shielding structure and the in-pixel grid structure may be biased to some desired voltage level by coupling the light shielding structure and the in-pixel grid structure to nearby circuitry that is supplied with the desired biasing voltage. The circuitry and methods described herein are merely illustrative and do not serve to limit the scope of the present invention. If desired, other suitable ways of shorting the light shielding structure and the in-pixel grid structure to biasing circuitry may be employed without departing from the spirit of the invention.

Figure 13:
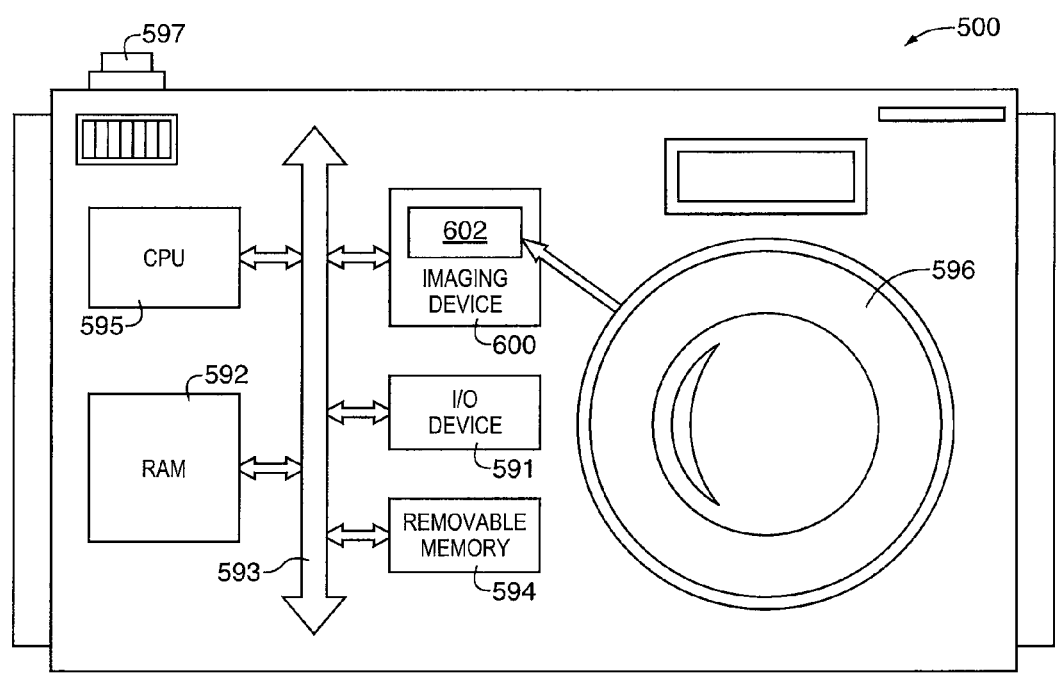
FIG. 13 is a block diagram of a system employing at least some of the embodiments of FIGS. 3-12 in accordance with an embodiment of the present invention.

FIG. 13 shows in simplified form a typical processor system 500, such as a digital camera, which includes an imaging device 600. Imaging device 600 may include a pixel array 602 having pixels of the type shown in FIG. 1 (e.g., pixel array 602 may be an array of image pixels formed on an image sensor SOC). Processor system 500 is exemplary of a system having digital circuits that may include imaging device 600. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens such as lens 596 for focusing an image onto a pixel array such as pixel array 30 when shutter release button 597 is pressed. Processor system 500 may include a central processing unit such as central processing unit (CPU) 595. CPU 595 may be a microprocessor that controls camera functions and one or more image flow functions and communicates with one or more input/output (I/O) devices 591 over a bus such as bus 593. Imaging device 400 may also communicate with CPU 595 over bus 593. System 500 may include random access memory (RAM) 592 and removable memory 594. Removable memory 594 may include flash memory that communicates with CPU 595 over bus 593. Imaging device 400 may be combined with CPU 595, with or without memory storage, on a single integrated circuit or on a different chip. Although bus 593 is illustrated as a single bus, it may be one or more buses or bridges or other communication paths used to interconnect the system components.

Various embodiments have been described illustrating an electronic device (see, e.g., device 10 of FIG. 1) that includes an imaging system and host subsystems. An imaging system may include one or more image sensors. Each image sensor may include an array of image pixels formed on a semiconductor substrate. Each image pixel may include one or more photosensitive elements configured to convert incoming light into electric charges.

In particular, imaging circuitry may include an image sensor die stacked on top of a digital signal processor (DSP) die. The image sensor die may include a substrate, photosensitive elements (e.g., photodiodes) formed in the substrate, a light shielding structure formed over at least some of the photodiodes, and a conductive structure that is formed through the semiconductor substrate and that provides a bias voltage to the light shielding structure.

In one embodiment, the conductive structure may be a through-oxide via (TOV) that extends at least partially into the DSP die. The light shielding structure and the TOV may be formed from different materials. An antireflective coating (ARC) layer may be interposed between the light shielding structure and the substrate, and the light shielding structure may make contact with the TOV through an opening in the ARC layer. In another suitable embodiment, the conductive structure may be an integral part of the light shielding structure (e.g., the light shielding structure and the conductive structure may be formed at the same time from the same material). In yet another suitable embodiment, the conductive structure may be configured to make direct physical contact with a conductive gate structure (e.g., a polysilicon gate conductor).

The image sensor die may also include an in-pixel grid having slots that are aligned to the photodiodes. The in-pixel grid may also receive a bias voltage. The in-pixel grid may be coupled to a peripheral contact (e.g., a deep trench isolation contact member) through a contact line. In one suitable arrangement, the peripheral contact may be coupled to a light shielding structure or a similar conductive strap through which the bias voltage may be supplied. In another suitable arrangement, the peripheral contact may be coupled to a through-oxide via. The peripheral contact may either be formed at a location outside the through-oxide via or inside the through-oxide via. In yet another suitable embodiment, the peripheral contact may be coupled to an aluminum strap.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. Imaging circuitry, comprising:
a digital signal processor die; and
an image sensor die mounted on the digital signal processor die, wherein the image sensor die comprises:
   a semiconductor substrate;
   photosensitive elements formed in the semiconductor substrate;
   a light shielding structure formed over at least some of the photosensitive elements; and
   a conductive structure that is formed through the semiconductor substrate and that provides a bias voltage to the light shielding structure.

2. The imaging circuitry defined in claim 1, wherein the conductive structure comprises a through-oxide via (TOV) that extends at least partly into the digital signal processor die.

3. The imaging circuitry defined in claim 2, wherein the light shielding structure and the through-oxide via are formed from different materials.

4. The imaging circuitry defined in claim 3, wherein the image sensor die further comprises:
   an antireflective coating (ARC) layer interposed between the light shielding structure and the semiconductor substrate, wherein the light shielding structure makes contact with the through-oxide via through an opening in the antireflective coating layer.

5. The imaging circuitry defined in claim 1, wherein the light shielding structure and conductive structure are formed at the same time.

6. The imaging circuitry defined in claim 1, wherein the light shielding structure and the conductive structure are formed from the same material.

7. The imaging circuitry defined in claim 1, wherein the image sensor die further comprises:
   a conductive gate structure that makes direct physical contact with the conductive structure.

8. The imaging circuitry defined in claim 7, wherein the conductive gate structure comprises a polysilicon gate structure.

9. The imaging circuitry defined in claim 1, wherein the bias voltage that is provided to the light shielding structures comprises a voltage selected from the group consisting of: a ground voltage, a positive power supply voltage, and a negative power supply voltage.

10. Imaging circuitry, comprising:
a digital signal processor die; and
an image sensor die mounted on the digital signal processor die, wherein the image sensor die comprises:
   a semiconductor substrate;
   photosensitive elements formed in the semiconductor substrate; and
   an in-pixel grid structure having slots aligned to the photosensitive elements, wherein the in-pixel grid structure receives a bias voltage.

11. The imaging circuitry defined in claim 10, wherein the image sensor die further comprises:
   a peripheral contact that is coupled to the in-pixel grid structure; and
   a contact line that electrically connects the in-pixel grid structure to the peripheral contact.

12. The imaging circuitry defined in claim 11, wherein the image sensor die further comprises:
   a light shielding structure that is coupled to the peripheral contact, wherein the bias voltage is received through the light shielding structure.

13. The imaging circuitry defined in claim 11, wherein the image sensor die further comprises:
   a tungsten strap that is coupled to the peripheral contact, wherein the bias voltage is received through the tungsten strap.

14. The imaging circuitry defined in claim 11, wherein the image sensor die further comprises:
   a through-oxide via (TOV) that extends at least partly into the digital signal processor die and that is coupled to the peripheral contact, wherein the bias voltage is received through the through-oxide via.

15. The imaging circuitry defined in claim 14, wherein the contact line is routed to a location that is outside the through-oxide via.

16. The imaging circuitry defined in claim 14, wherein the contact line is routed to a location that is inside the through-oxide via.

17. The imaging circuitry defined in claim 11, wherein the image sensor die further comprises:
   an aluminum strap that is coupled to the peripheral contact, wherein the bias voltage is received through the aluminum strap.

18. The imaging circuitry defined in claim 11, wherein the peripheral contact comprises a deep trench isolation (DTI) structure that is formed in the semiconductor substrate.

19. The imaging circuitry defined in claim 10, wherein the in-pixel grid comprises a structure selected from the group consisting of: an opaque or reflective structure for optical confinement and for electrical insulation that is formed only partially in the semiconductor substrate, an opaque or reflective structure for optical confinement and for electrical insulation that is formed completely within the semiconductor substrate, and an opaque or reflective structure for optical confinement and for electrical insulation that is formed completely out of the semiconductor substrate.

20. The imaging circuitry defined in claim 10, wherein the bias voltage that is received by the in-pixel grid structure comprises a voltage selected from the group consisting of: a ground voltage, a positive power supply voltage, and a negative power supply voltage.

21. A system, comprising:
a signal processing unit;
memory;
a lens;
input-output circuitry; and
an imaging device that is stacked on the signal processing unit, wherein the imaging device comprises:
   a substrate having a front surface and a back surface;
   a plurality of imaging pixels formed in the front surface of the substrate;
   a dielectric layer formed over the back surface of the substrate;
   a light shield formed in the dielectric layer; and
   a conductive structure that is formed through the substrate and that provides a bias voltage to the light shield.

22. The system defined in claim 21, wherein the light shield comprises a tungsten light shield.

23. The system defined in claim 21, wherein the conductive structure comprises a through-oxide via (TOV) formed through the dielectric layer, wherein the through-oxide via extends at least partly into the signal processing unit.

24. The system defined in claim 21, wherein the imaging device further includes:
   an in-pixel matrix having slots aligned to each of the plurality of imaging pixels, wherein the in-pixel matrix also receives a bias voltage.

25. The system defined in claim 24, wherein the bias voltage that is provided to the light shielding structures and wherein the bias voltage that is received by the in-pixel matrix comprise a voltage selected from the group consisting of: a ground voltage, a positive power supply voltage, and a negative power supply voltage.

26. The system defined in claim 24, wherein the in-pixel matrix comprises a tungsten in-pixel grid structure.

27. The system defined in claim 24, wherein the imaging device further includes:
   a peripheral contact, wherein the light shield is formed over the peripheral contact; and
   a contact line that electrically connects the in-pixel matrix to the peripheral contact, wherein the bias voltage is received through the peripheral contact and the contact line.

* * * * *